(12) United States Patent
Aoki et al.

(10) Patent No.: US 6,288,911 B1
(45) Date of Patent: Sep. 11, 2001

(54) HOT PLUG SOLUTION AND ADJUSTABLE RETENTION BRACKET

(75) Inventors: Russell S. Aoki, Kent; Mohammed N. Haq, Lacey, both of WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/251,751

(22) Filed: Feb. 18, 1999

(51) Int. Cl.[7] .................................................. H05K 7/14
(52) U.S. Cl. ..................... 361/801; 361/686; 361/753; 361/802; 211/41.17; 439/377
(58) Field of Search .................................... 361/752, 753, 361/754, 796, 798, 801, 802, 683, 686; 439/377, 259, 376; 211/41.17

(56) References Cited

U.S. PATENT DOCUMENTS

| | | | |
|---|---|---|---|
| 5,751,559 | * 5/1998 | Jensen et al. ......................... | 361/802 |
| 5,868,585 | * 2/1999 | Barthel et al. ........................ | 439/377 |
| 6,033,254 | * 3/2000 | Neal et al. ............................ | 439/377 |
| 6,062,894 | * 5/2000 | Barringer ............................. | 439/377 |
| 6,094,358 | * 7/2000 | Christensen et al. ................ | 361/785 |

* cited by examiner

Primary Examiner—Jayprakash N. Gandhi
(74) Attorney, Agent, or Firm—Antonelli, Terry, Stout & Kraus, LLP

(57) ABSTRACT

Disclosed is structure and methods for engaging/disengaging a peripheral component interconnect compliant card with/from a slot therefor, without having to power down the system (e.g., computer) or remove any system chassis components. The structure includes a bracket to hold the card, which bracket can be adjustable to hold cards of different sizes. The structure also includes a frame member attached to the system chassis, the frame member having a guide rail to guide the bracket and peripheral component interconnect compliant card to engage/disengage the card with/from the slot therefor. The adjustable retention bracket can be used independently of use of the frame member, to hold peripheral component interconnect compliant cards rigid and stable.

35 Claims, 11 Drawing Sheets

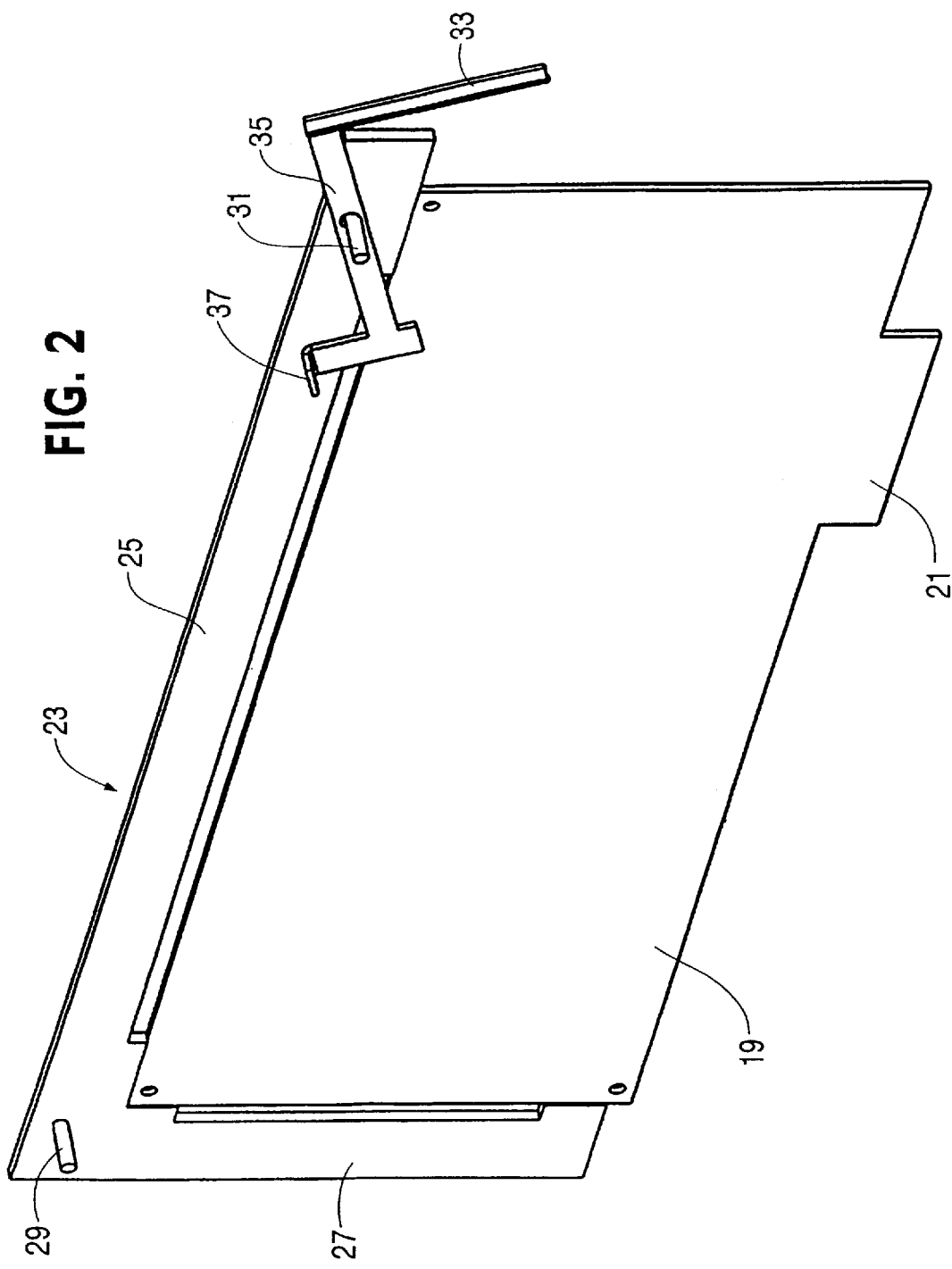

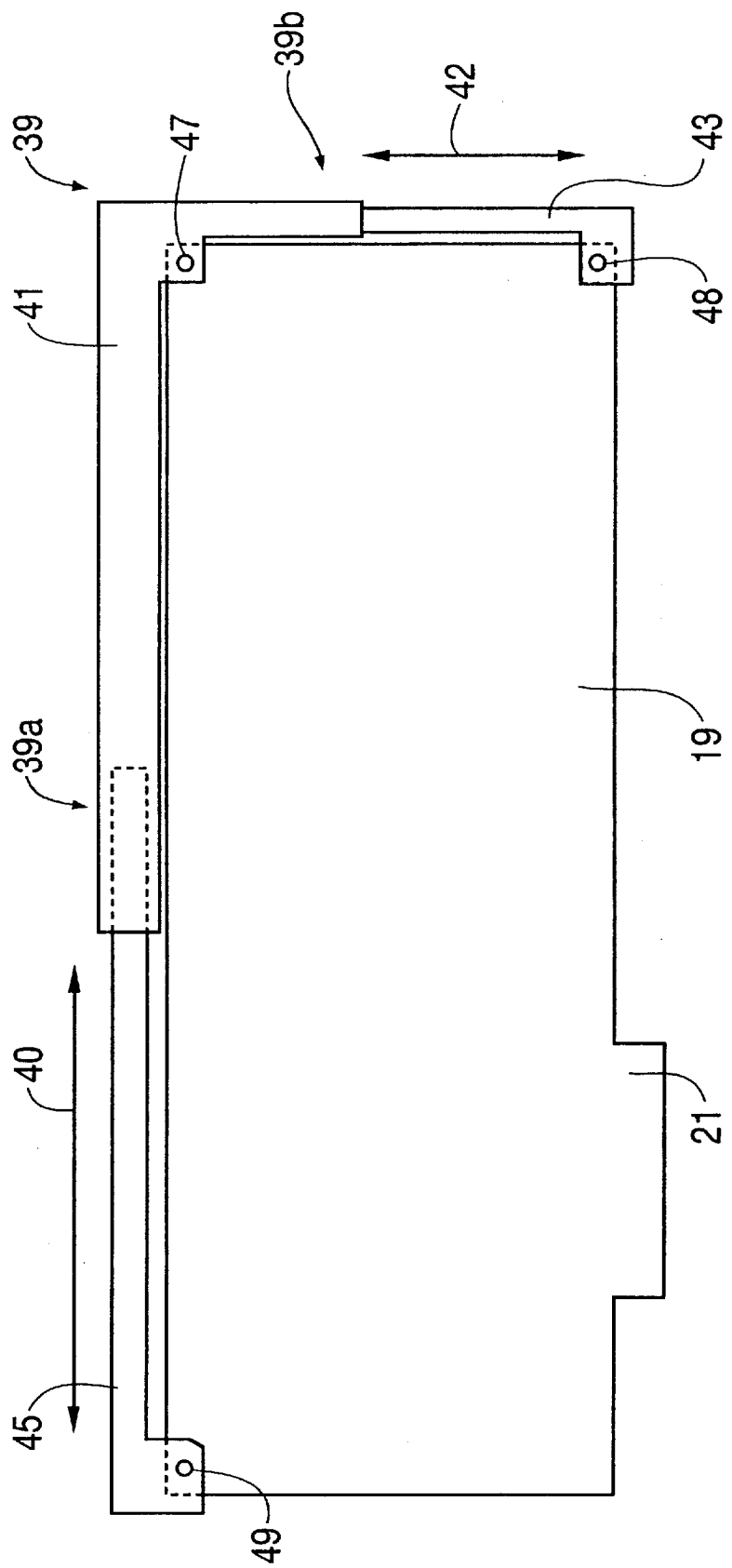

HOT PLUG SOLUTION AND ADJUSTABLE RETENTION BRACKET

FIELD

The present invention is directed to a hot plug peripheral component interconnect (PCI) structure, and methods of operating such structure.

In addition, the present invention is directed to adjustable retention brackets for holding PCI compliant cards of different heights and different lengths.

BACKGROUND

Modern computer systems, such as servers, workstations and personal computers, include cards that comply with the PCI bus specification, the latest version of which is "PCI Local Bus Specification, Revision 2.1", set forth by the PCI Special Interest Group (SIG) on Jun. 1, 1995. Hereinafter, such cards in compliance with the PCI bus specification (that can be electrically connected to PCI busses complying with the PCI bus specification) are called PCI compliant cards.

Currently, there is known a top access hot plug structure, to engage/disengage PCI compliant cards with/from slots therefor in the system (e.g., computer), without powering down the system. This top access structure requires entry and removal of the PCI compliant card vertically, through the top of the, e.g., computer chassis or frame. However, this structure has various disadvantages, including a requirement of an undue amount of space.

Currently, there is no hot plug mechanism available in the market, which can be used to insert/remove PCI compliant cards horizontally from a rear of the chassis.

Furthermore, at the present time there is also no standard fixture available in the market, to retain PCI compliant cards of different sizes. That is, there is no bracket on the market which can be utilized to keep PCI compliant cards, of different sizes (different lengths and/or heights), e.g., rigid and stable.

SUMMARY

The present invention, in various embodiments, includes a hot plug structure, for engaging a PCI compliant card in a slot therefor of a system. This hot plug structure includes a frame member, having guiding structure to guide a PCI compliant card to enter a slot therefor of a system. The guiding structure has a first section spaced, in a first direction, from the slot; a second section, at a first end portion of the guiding structure, to guide a first end of the PCI compliant card closer to the slot in the first direction; and a third section, at a second end portion of the guiding structure opposite the first end portion, to guide a second end of the PCI compliant card closer to the slot in the first direction. By guiding the first and second ends of the PCI compliant card by the second and third sections of the guiding structure, the PCI compliant card is engaged in the slot.

BRIEF DESCRIPTION OF THE DRAWINGS

FIG. 2 is a perspective view of an example of a retention bracket holding a PCI compliant card, according to an example and illustrative embodiment of the present invention.

FIG. 3 is a side view of an example of an adjustable retention bracket for holding PCI compliant cards of different sizes, according to an example and illustrative embodiment of the present invention.

DETAILED DESCRIPTION

Figure 1:
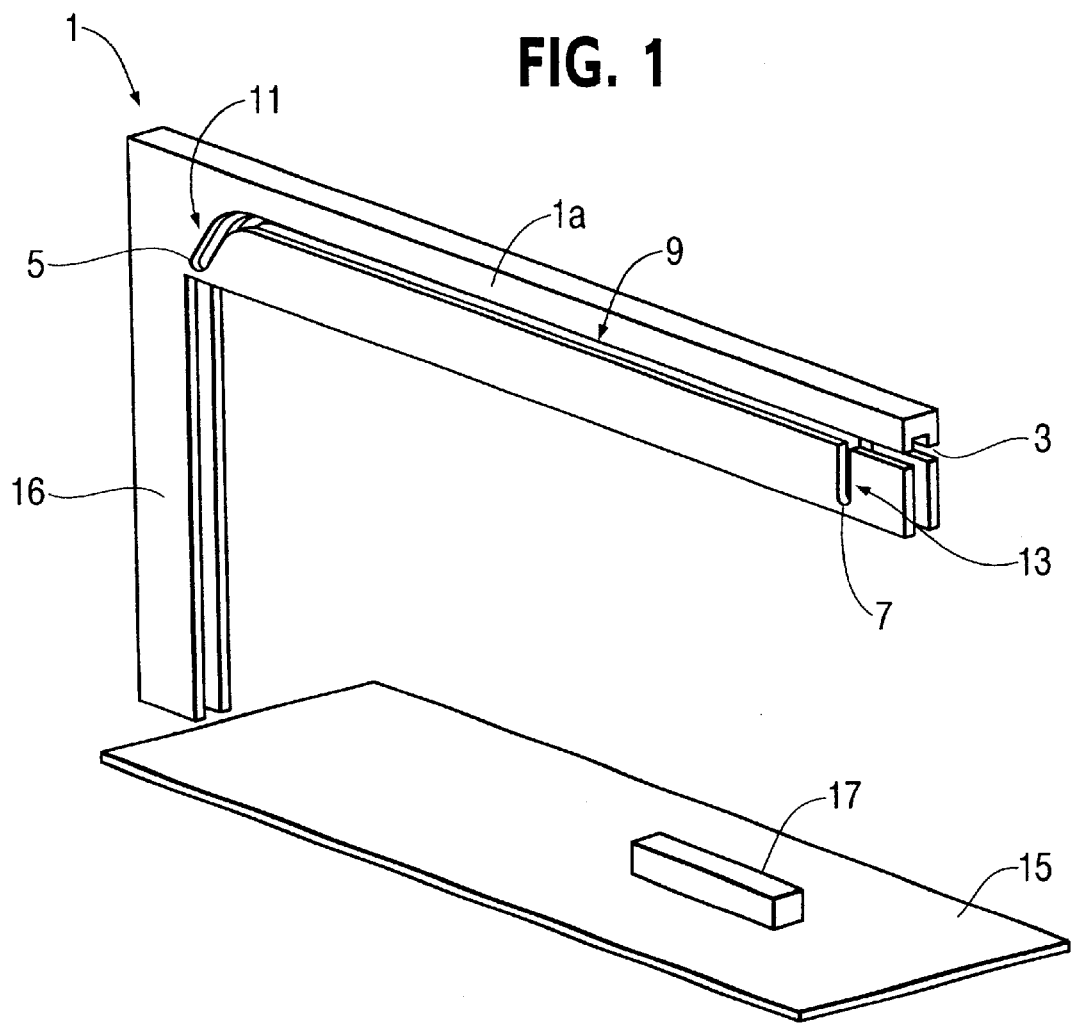
FIG. 1 is a perspective view of an example of a chassis structure of a computer, of a first example and illustrative embodiment of the present invention.

While the invention will be described in connection with specific examples and illustrative embodiments, it will be understood that it is not intended to limit the invention to these described examples and illustrative embodiments. To the contrary, it is intended to cover all alterations, modifications and equivalents as may be included within the spirit and scope of the invention as defined by the appended claims.

Examples and illustrative embodiments of the present invention, in the following, are described in connection with the various drawing figures. The various components in the drawing figures having corresponding functions are referred to using common reference numerals.

FIG. 1 is a perspective view showing an illustrative frame member 1 and its relationship to a base board 15 and slot 17, of the base board 15, according to an example and illustrative embodiment of the present invention. In FIG. 1, frame member 1 includes legs 1a and 1b. Illustratively, this frame member 1 is mounted to a chassis of a system, e.g., a chassis of a computer.

The frame member 1 includes rail 3, acting as guiding structure for a PCI compliant card, e.g., held by a retention bracket, to be engaged with slot 17. This rail 3 includes a first section 9, which generally extends in a plane parallel to base board 15, in a direction substantially parallel to slot 17.

The rail 3 also includes a second section 11 and third section 13, which extend in directions so as to end in positions closer to the slot 17, in the direction between the slot 17 and the first section 9 of rail 3, than first section 9 of rail 3 is to the slot 17. That is, a distance between the ends of the second section 11 and third section 13, on the one hand, and base board 15, on the other, is less than a distance between first section 9 and base board 15. The guiding structure also includes first guide slot 5 and second guide slot 7, at the ends respectively of second section 11 and third section 13. As can be seen in FIG. 1, second section 11 desirably extends in a smooth continuous curve from the first section 9 to first guide slot 5, to facilitate movement of a PCI compliant card, e.g., held by a retention bracket, along rail 3. The third section 13, and the second guide slot 7, extend discontinuously from the first section 9 of rail 3, extending, illustratively, substantially perpendicularly to the first section 9 of rail 3. Thus, illustratively where base board 15 is positioned horizontally, third section 13 can be positioned vertically.

An illustrative retention bracket 23 for holding a PCI compliant card, which can be used with the frame member 1 of FIG. 1 for engaging and disengaging a PCI compliant card 19 and slot 17, is shown in FIG. 2. Retention bracket 23 holds PCI compliant card 19, which has card connector 21 to engage with the slot 17 (see FIG. 1). Specifically, electrical contacts of connector 21 are to be electrically connected to electrical contacts in the slot 17. The retention bracket 23 has a first portion 25 which extends along a length of PCI compliant card 19, and a second portion 27 which extends along a height of PCI compliant card 19. The retention bracket 23 includes pins 29 and 31, respectively at the back of PCI compliant card 19 and at the front of PCI compliant card 19, which ride along rail 3 of frame member 1 shown in FIG. 1.

Also forming part of the retention bracket 23 is engage/disengage handle 33, attached to lever 35. At the end of lever 35 is projection 37, which together with pins 29 and 31 ride in rail 3 of the frame member 1 of FIG. 1. Utilizing the projection 37, rotating handle 33 (with corresponding movement of lever 35) co-acts the projection 37 against the rail 3 of frame member 1 so as to provide a mechanical advantage in forcing card connector 21 into engagement with slot 17. Moreover, rotating the handle in the opposite direction also provides a mechanical advantage in disengaging card connector 21 from slot 17.

Figure 6A:
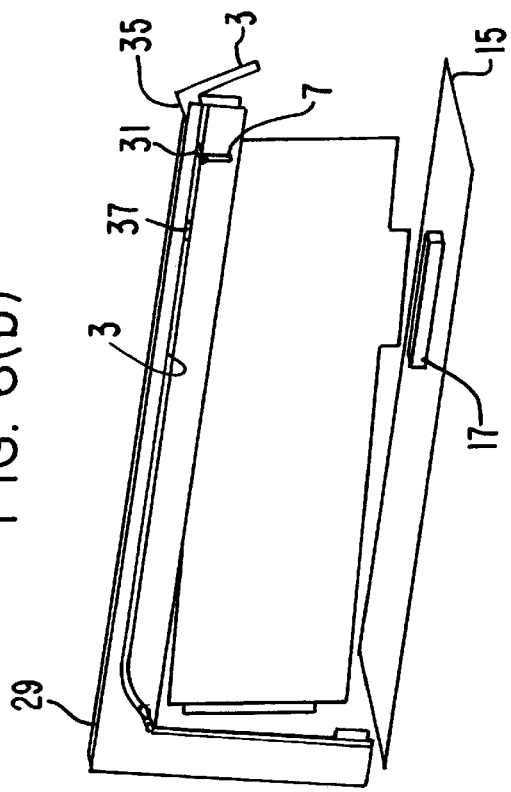
FIGS. 6(a)–6(c) illustrate an example of a method of engaging a PCI compliant card to a slot, according to an example and illustrative embodiment of the present invention.

Operation of the structure of FIGS. 1 and 2 will be set forth in the following, particularly with respect to FIGS. 6(a), 6(b) and 6(c). That is, in operation pin 29 of retention bracket 23 enters rail 3 of frame member 1, and moves along the first section 9 of rail 3. As can be appreciated from FIG. 6(a), the first section 9 of rail 3 is sufficiently distant from base board 15 and slot 17 so that PCI compliant card 19 (and its connector 21) clears base board 15 and slot 17. With continued movement of retention bracket 23 (and PCI compliant card 19 held thereby) along rail 3, pin 29 of retention bracket 23 moves along the first section 9 of rail 3, and projection 37 and pin 31 also enter rail 3.

Figure 6B:
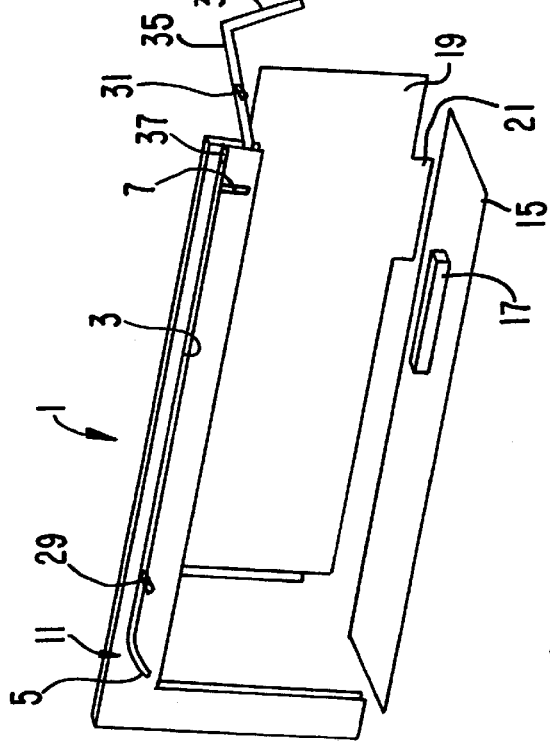

As seen in FIG. 6(b), as movement of the retention bracket 23 continues along the rail, pin 29 drops down into second section 11 and then rests in first guide slot 5. At this point, card connector 21 is positioned over slot 17, ready for final insertion. The end of PCI compliant card 19 first entering frame member 3 (that is, the back of PCI compliant card 19) is lower than an opposite end of PCI compliant card 19. With pin 29 in first guide slot 5, pin 31 is over second guide slot 7, ready to be inserted into second guide slot 7.

Figure 6C:
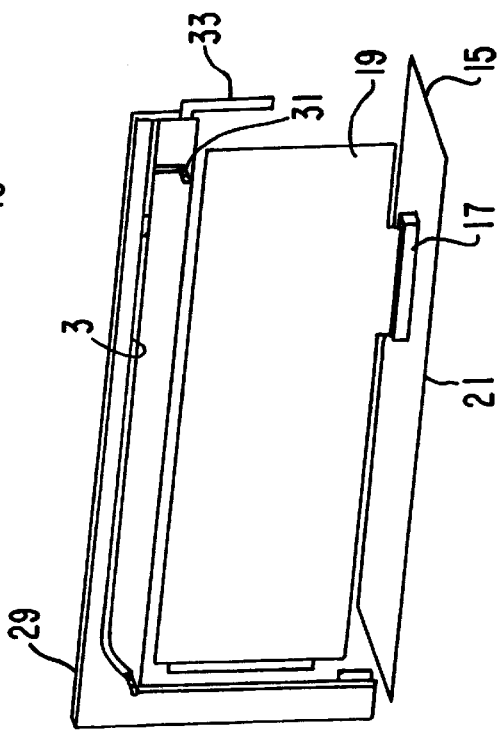

FIG. 6(c) shows handle 33 having been rotated to cause projection 37 in rail 3 to push against frame member 1 and push retention bracket 23 so as to position pin 31 in second guide slot 7 and push PCI compliant card 19 (in particular, connector 21 thereof) to engage slot 17 therefor. In pushing pin 31 into second guide slot 7, the bracket/PCI card pivots on the pin 29.

The foregoing describes how engagement of card connector 21 and slot 17 takes place. To disengage, the foregoing steps are performed in reverse. That is, initially, the handle is rotated in an opposite direction from that previously, in order to lift pin 31 out of second guide slot 7. This also frees connector 21 of PCI compliant card 19 from slot 17. With pin 31 free of the second guide slot 7, the bracket 23 and PCI compliant card 19 can be moved along rail member 3 so as to remove the bracket 23 and PCI compliant card 19 from frame member 1. Rail 3 of frame member 1 is exposed via an opening, e.g., in the rear of the chassis of the, e.g., computer, the opening being sufficiently large to pass therethrough the retention bracket 23 and PCI compliant card 19 attached thereto.

Figures 4A, 4B:
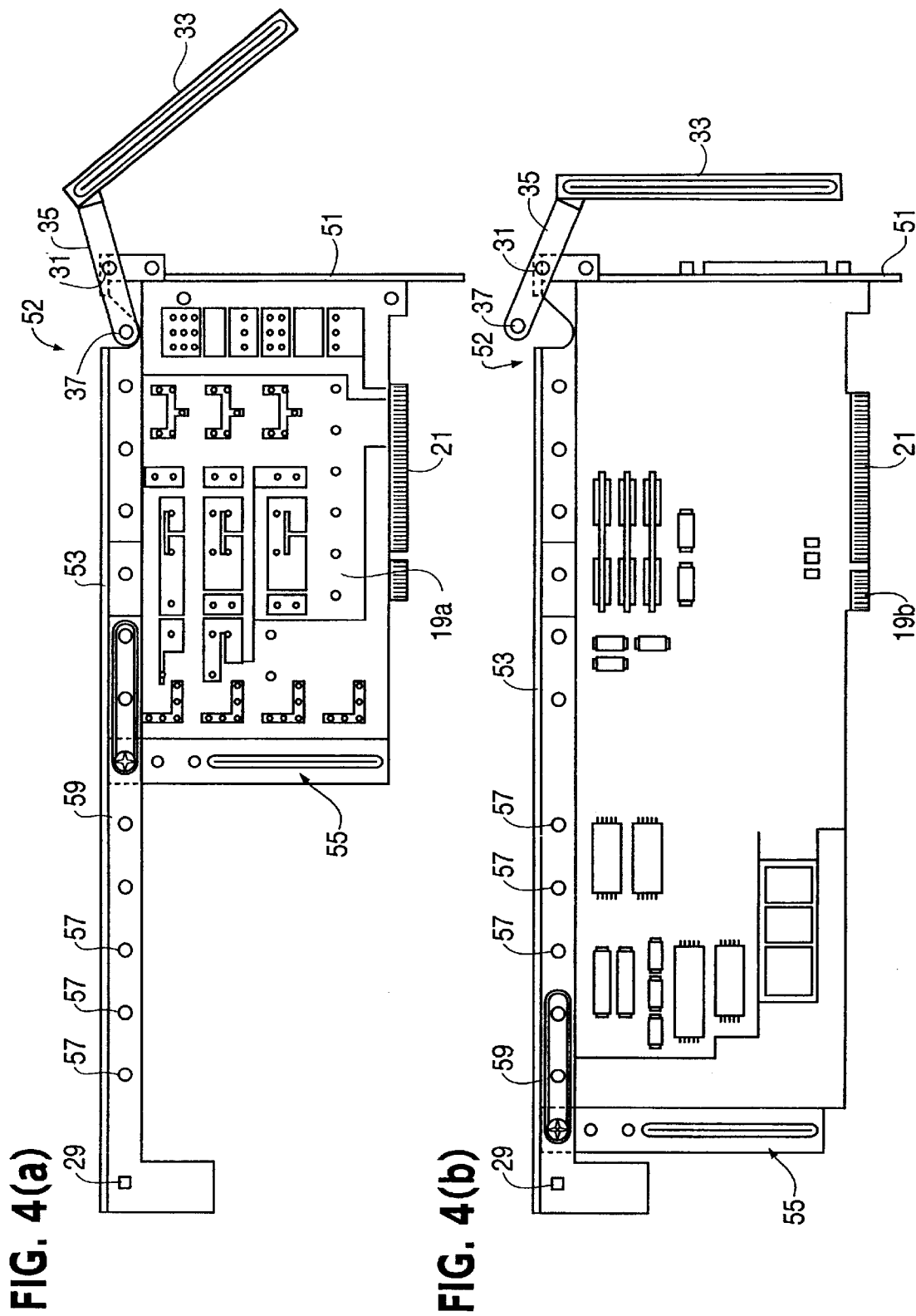
FIGS. 4(a) and 4(b) are side views of an example of an adjustable retention bracket for holding PCI compliant cards of different sizes, and which can be utilized with an example and illustrative embodiment of a hot plug structure according to the present invention, with FIGS. 4(a) and 4(b) respectively showing PCI compliant cards of different sizes being retained in the adjustable retention bracket.

FIGS. 4(a) and 4(b) show an adjustable retention bracket 52 which can be used as the retention bracket inserted into rail 3 according to an example and illustrative embodiment of the present invention. In FIG. 4(a), a PCI compliant card 19a having a relatively small length is held, while in FIG. 4(b) a PCI compliant card 19b having a relatively greater length is held. Each of the PCI cards 19a, 19b includes standard L-shaped bracket 51 at a front end of the PCI card. As seen in FIGS. 4(a) and 4(b), the position of connector 21 of the different cards 19a, 19b, respectively of different lengths, is standardized with respect to distance from a front of the PCI compliant card (that is, the end of the card which enters frame member 1 last), so that these connectors of cards of different lengths will fit into a same slot. In FIGS. 4(a) and 4(b), bracket member 53 extending in a length direction of the PCI compliant card has a fixed length. The bracket member 55 extending in a height direction of the PCI card can be positioned at various locations 57 along bracket member 53, for adjusting an effective length of the bracket (in the length direction), for accommodating PCI compliant cards 19 of different lengths (e.g., cards 19a, 19b). Also shown in FIGS. 4(a) and 4(b) are screws 59, for attaching bracket member 55 to bracket member 53. The adjustable retention bracket 52 thus can hold PCI compliant cards 19 of different lengths, while being guided using a same frame member 1. In this regard, note that a distance between pins 29 and 31 in the adjustable retention bracket 52 in FIGS. 4(a) and 4(b) can be kept the same, notwithstanding that the brackets hold PCI compliant cards of different lengths, so that these pins can be guided by the same rail 3.

Figure 5:
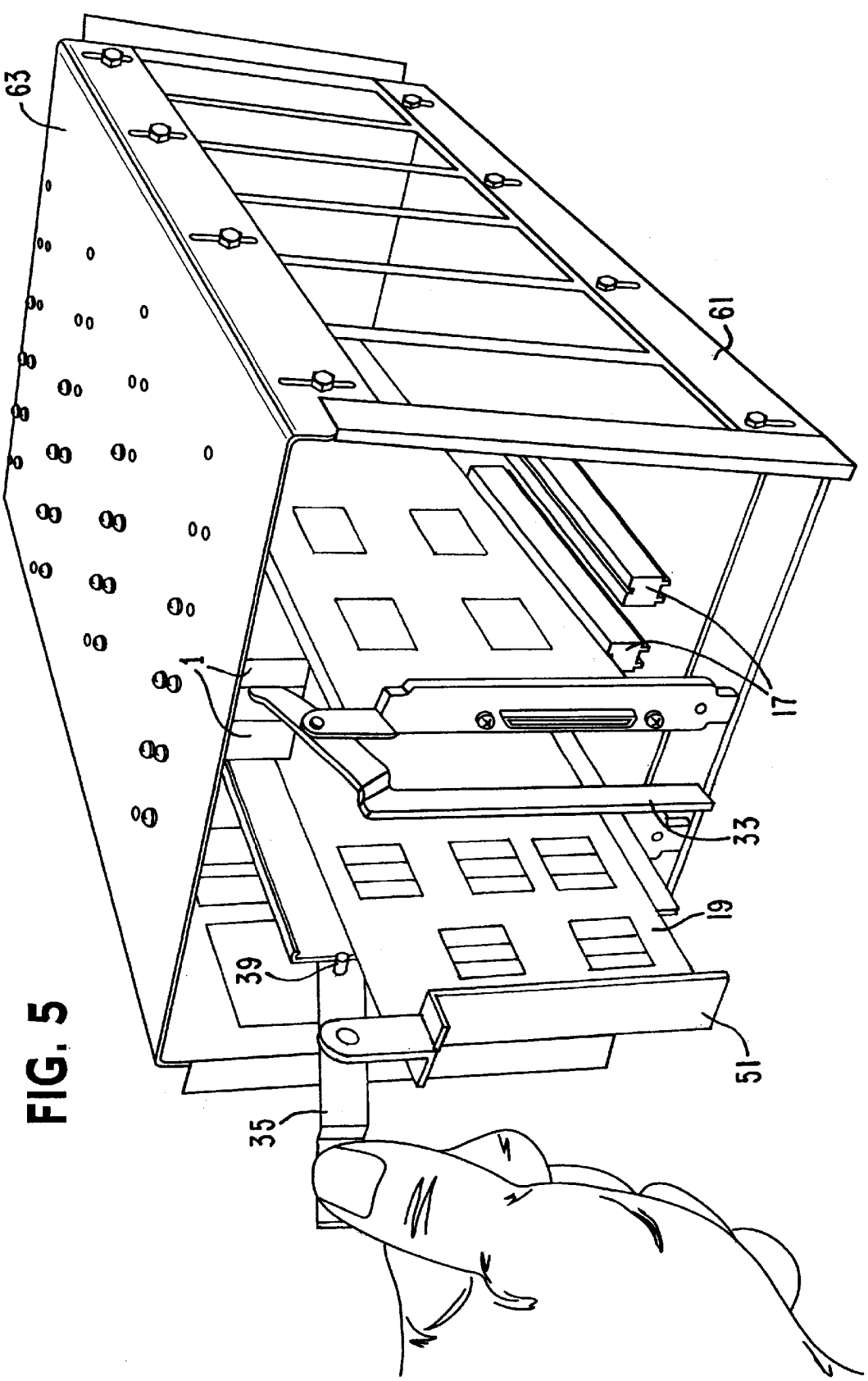
FIG. 5 is a perspective view of an example of chassis structure according to an example and illustrative embodiment of the present invention, showing a chassis structure with a plurality of slots respectively for engaging a plurality of PCI compliant cards.

FIG. 5 shows a further example and illustrative embodiment according to the present invention, wherein a frame 61 of, e.g., 10 a computer has a plurality of frame members 1, for respectively guiding a plurality of PCI compliant cards 19 into engagement with, and disengagement from, respective slots 17. In FIG. 5, the frame members 1 are attached to an inside surface of top 63 of chassis 61. Also shown in FIG. 5 is L-shaped bracket 51 at the front end of PCI compliant card 19. In FIG. 5, a PCI compliant card 19 is shown engaged in slot 17; and another PCI compliant card 19 is in the process of being slid along a frame member 1, for engagement with a corresponding slot 17. While FIG. 5 shows a frame member 1 for each slot 17, the present invention is not so limited, and it is contemplated that more than one slot 17 can be associated with each frame member.

In the structure of FIG. 5, and to be illustrative and not limiting, the frame members (and correspondingly, the slots)

can be positioned at one inch pitches; however, mounting can be modified to accommodate other pitches. This design shown in FIG. 5 can be used for both 32 and 64 bit PCI compliant cards.

Figure 7A:
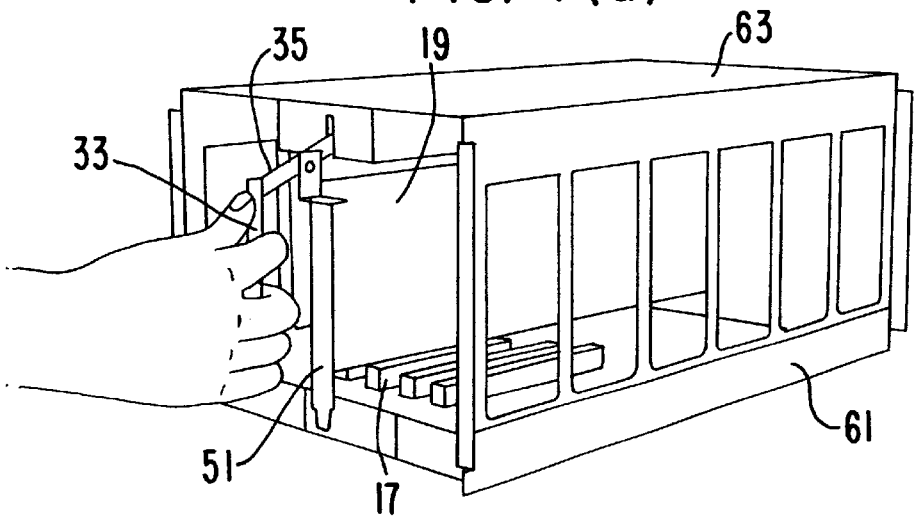
FIGS. 7(a)–7(d) illustrate an example of a method of disengaging a PCI compliant card from a slot therefor, according to an example and illustrative embodiment of the present invention.
Figure 7B:
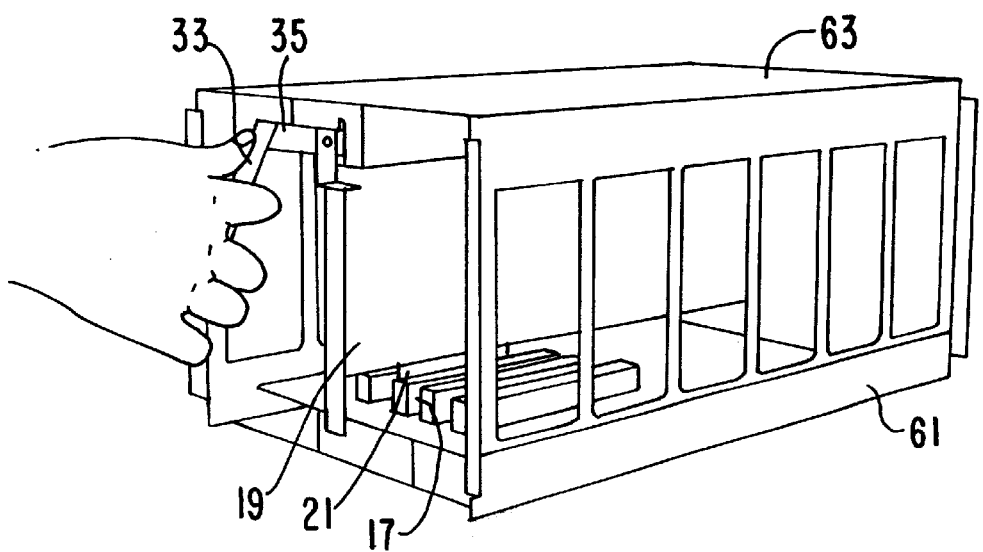

FIGS. 7(a)–7(d) show, in perspective view, an illustrative embodiment for disengaging PCI compliant card 19 from slot 17, according to an example and illustrative embodiment of the present invention. FIG. 7(a) shows PCI compliant card 19 fully engaged in slot 17 (in particular, connector 21 is in electrical contact with contacts in slot 17). FIG. 7(b) shows handle 33 being raised (whereby lever 35 is rotated around a pivot pin (pivot pin 31) as shown in FIG. 2) to force the PCI compliant card 19 to rise out of slot 17. FIG. 7(b) shows the PCI compliant card 19 unseated from slot 17.

Figure 7C:
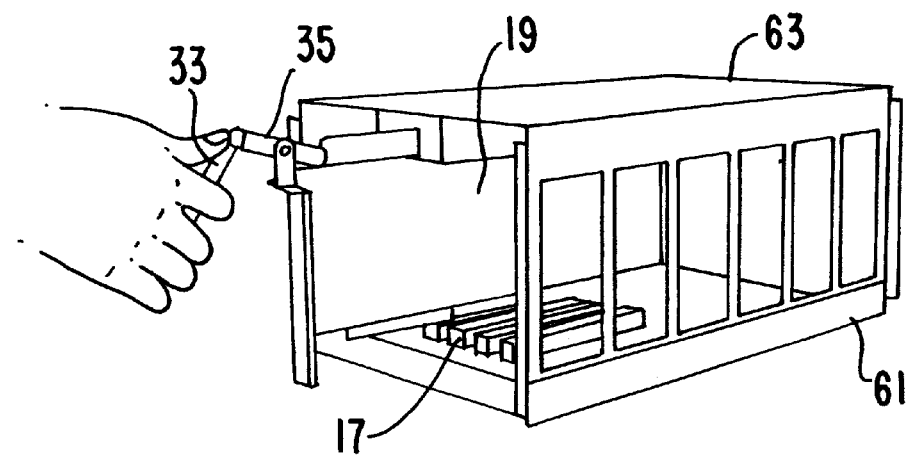

In FIG. 7(c) is shown PCI compliant card 19 being allowed to slide out of chassis 61 on a rail (e.g., a plastic rail).

Figure 7D:
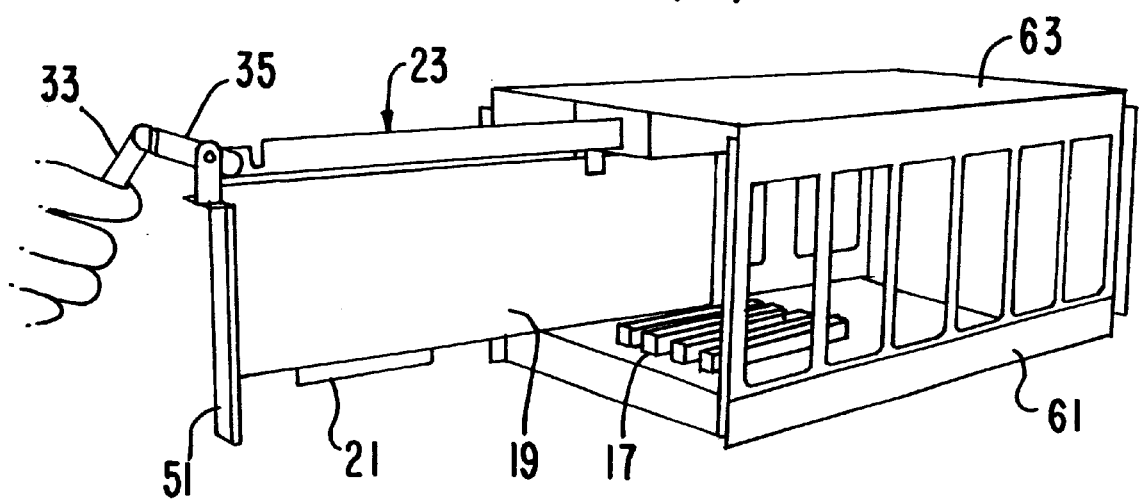

In FIG. 7(d), PCI compliant card 19 is ready to be removed from chassis 61.

Figure 8:
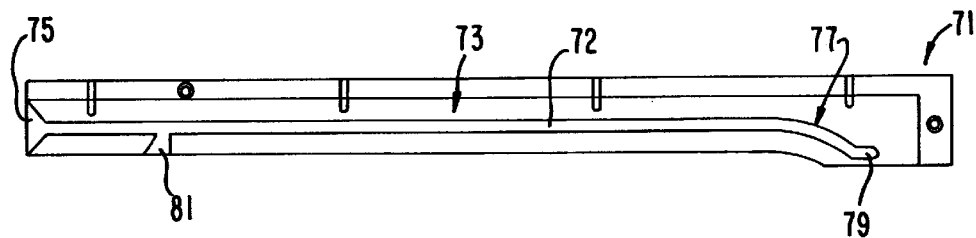
FIG. 8 is a side view of an example of a frame member according to another example and illustrative embodiment of the present invention.

FIG. 8 shows an alternative embodiment of a frame member, according to another example and illustrative embodiment of the present invention. In FIG. 8, frame member 71 has rail 73. Opening 75 to rail 73 (that is, where pins on a retention bracket are introduced to rail 73) has a tapered shape, to facilitate introduction of the retention bracket (and PCI compliant card) to rail 73. Rail 73 includes second section 77, which is a continuously curved section extending from first section 72, so as to smoothly facilitate movement of the retention bracket (and, correspondingly, the PCI compliant card) along rail 73. The section 77 ends in first guide slot 79, which extends parallel to first section 72, but at a location closer to a base board having a slot for the PCI compliant card, in a direction between the base board and first section, than the position of the first section. Also shown in FIG. 8 is second guide slot 81, for, e.g., vertically lowering the front end of the PCI compliant card for engagement with the slot therefor (more specifically, for providing electrical connection between the connector of the PCI compliant card and electrical contacts in the slot). This second guide slot 81 is also tapered, having a larger opening at an end thereof closer to the slot 17, to facilitate movement of the PCI compliant card when disengaging the PCI compliant card from the slot. As can be appreciated, this frame member 71 can be attached to an inside surface of the top of a chassis of, e.g., a computer, where the base board of the computer includes the slot for the card, for horizontally moving the card into the chassis and then vertically engaging the card with the slot therefor.

Figure 9:
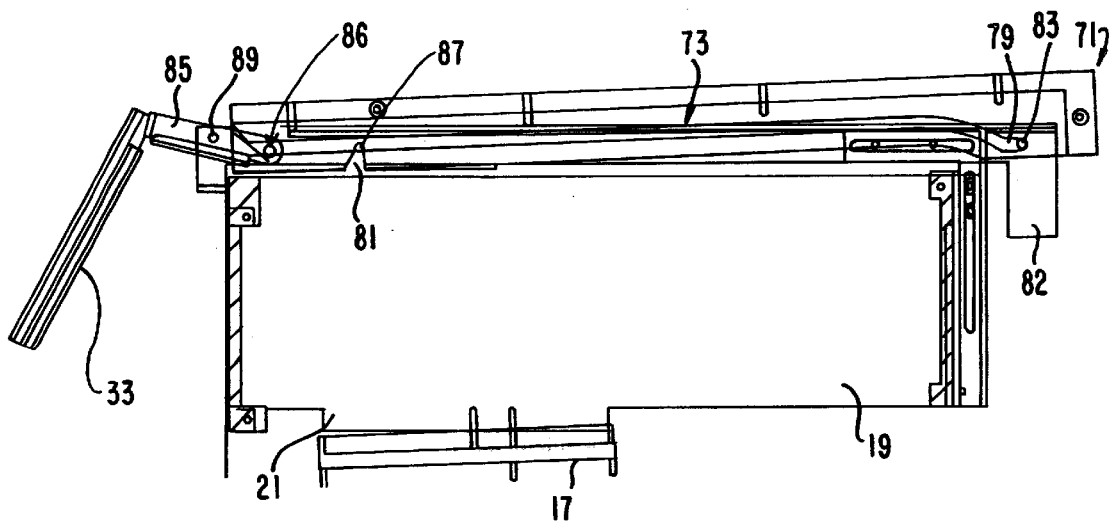
FIG. 9 is a side view of an example of a hot plug solution according to an example and illustrative embodiment of the present,invention, using the frame member of FIG. 8.

FIG. 9 shows use of the illustrative frame member 71 of FIG. 8, in engaging connector 21 of PCI compliant card 19 with slot 17. FIG. 9 shows the PCI compliant card 19 just prior to being engaged into slot 17, which engagement will be achieved by rotating handle 33 downward. As shown in FIG. 9, pivot point pin 83 is situated in first guide slot 79. Alignment pin 87 is positioned above second guide slot 81, ready to be moved vertically downwardly, thereby moving the PCI compliant card 19 vertically downwardly to engage connector 21 of PCI compliant card 19 into slot 17. Movement of handle 33 around handle pivot point 89 causes lever 85 to move around handle pivot point 89. Movement of lever 85 causes pin 86 thereof, in rail 73, to coact with frame member 71, to produce force on the retention bracket 82 and, correspondingly, PCI compliant card 19, to force connector 21 of PCI compliant card 19 into slot 17.

Figure 10:
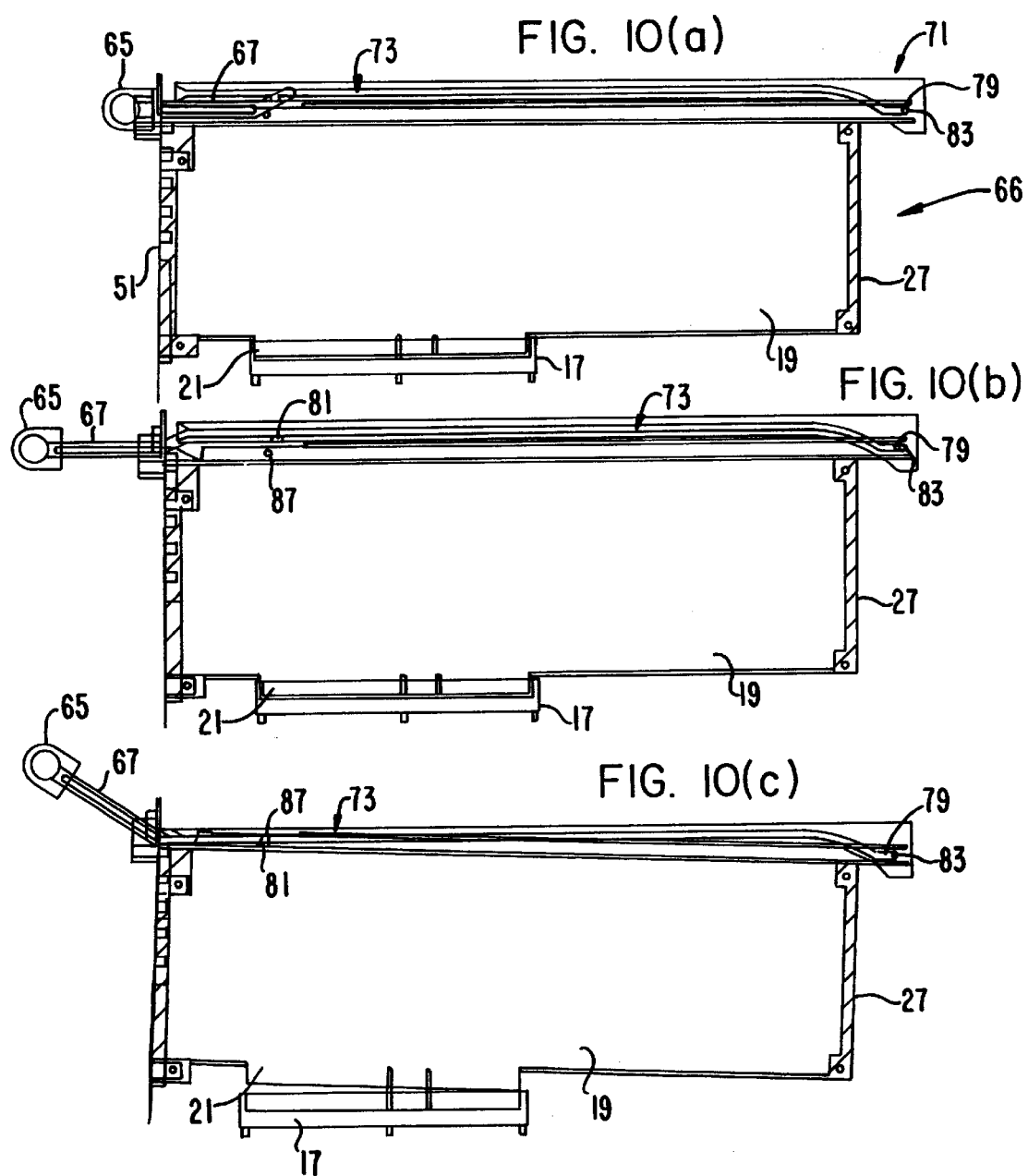
FIGS. 10(a)–10(c) are side views illustrating another example and illustrative structure according to the present invention, illustrating disengagement of a PCI compliant card from a slot therefor.

FIGS. 10(a)–10(c) and FIG. 11 show an alternative example and illustrative embodiment of a handle and lever for retention bracket 66, according to an illustration of the present invention. This handle and lever includes gripping portion 65 and sliding portion 67. When the handle and lever are not in use (e.g., are not being used for moving retention bracket 66 and PCI compliant card 19), the sliding portion 67 can be slid into the chassis along retention bracket 66, so as to minimize obstruction of the front of the PCI compliant card and, for example, allow cable access to the front of the PCI compliant card. Thus, as shown in FIG. 10(a) the sliding portion 67 is slid along retention bracket 66 into a chassis of the system (not shown) when the connector 21 of PCI compliant card 19 is fully engaged in slot 17, to minimize obstruction by the handle of the front of the PCI compliant card. In FIG. 10(b), the handle has been slid in a direction away from the PCI compliant card, and in FIG. 10(c) the handle has been rotated to press a pin on sliding portion 67, which is in rail 73, against rail 73, so as to provide a mechanical advantage and force the PCI compliant card 19 to rise out of slot 17. Of course, reverse steps can be utilized to engage the PCI compliant card 19 with slot 17.

Figure 11:
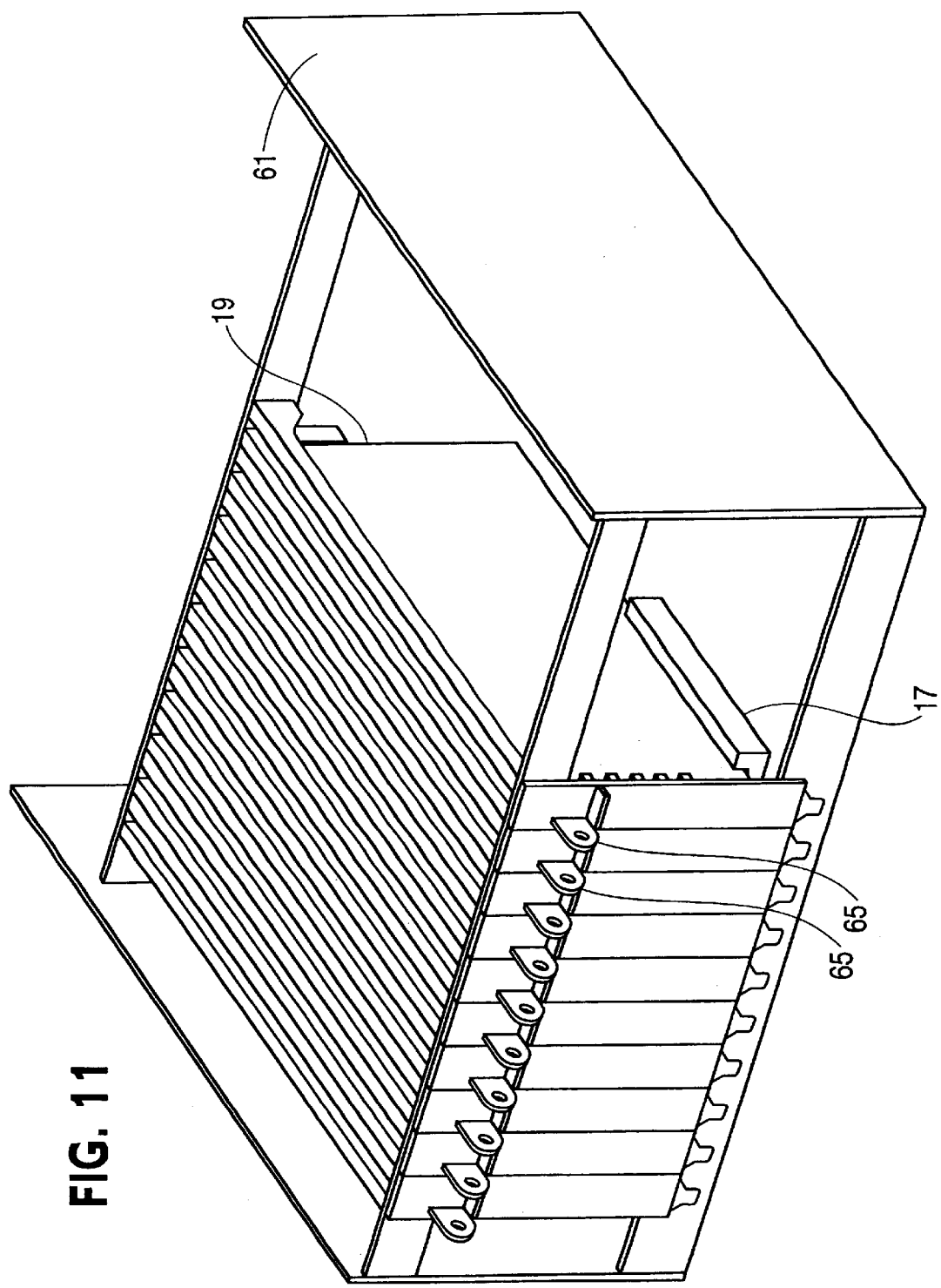
FIG. 11 is a perspective view of a chassis having a plurality of PCI compliant cards engaged respectively in slots therefor, having the example and illustrative structure shown in FIGS. 10(a)–10(c).

FIG. 11 shows a perspective view of this illustrative embodiment of FIGS. 10(a)–10(c), having the handle which can be slid into the chassis 61 to minimize obstruction of the front of the PCI compliant card. In FIG. 11, a plurality of PCI compliant cards 19 have been engaged with slots 17, and sliding portion 67 attached to handle 65 has been slid into chassis 61, to minimize obstruction, as discussed previously.

By the foregoing example and illustrative embodiment, obstruction of the front of the PCI compliant card is minimized, while still achieving a handle which provides mechanical advantage to insert/extract PCI compliant cards.

FIG. 3 shows an adjustable retention bracket 39, which permits adjustment of effective length of the bracket in both length direction 40 of PCI compliant card 19 and height direction 42 of PCI compliant card 19. Retention bracket 39 has first and second portions 39a and 39b, respectively extending along a length of PCI compliant card 19 and a height of PCI compliant card 19. In length direction 40 of PCI compliant card 19, bracket 39 includes second member 45 telescoping within first member 41, which has an L-shape and extends along both the length and height directions of the PCI compliant card 19. Third member 43 extends along height direction 42, and also telescopes within first member 41. In operation, members 45 and 43 can slide in and out of member 41, to accommodate different card lengths and different card heights, respectively. Members 45 and 43 can be friction fit within member 41, to maintain their positions. Alternatively, members 45 and 43 can be provided with set screws, to hold the members 45 and 43 in desired positions relative to first member 41. Also shown in FIG. 3 are fastening holes 47, 48 and 49, on members 41, 43 and 45, respectively, for fastening bracket 39 to PCI compliant card 19. Any suitable means can be utilized for attaching retention bracket 39 to PCI compliant card 19.

While FIG. 3 shows first member 41 as a single integral member, it can be two members respectively extending in length direction 40 and height direction 42. While FIG. 3 shows retention bracket 39 attached to tooling holes on PCI compliant card 19, it need not be attached to tooling holes, and any appropriate fastening technique can be used. For example, where the PCI compliant card has a standard L-shaped bracket at a front end thereof, the retention bracket can desirably be fastened to the L-shaped bracket.

In operation, the members 45 and 43 can be slid in or out of member 41, in order to accommodate the PCI compliant card, and then attached to the PCI compliant card, to keep the PCI compliant card rigid and stable.

The adjustable retention bracket and the frame member can each be made of suitable material (for example, extruded aluminum, or other metal or plastic) which is sturdy enough to avoid damage through use.

Embodiments of the present invention will be described generally in connection with various additional aspects thereof, in the following. As can be appreciated, the present invention is not limited to these aspects or embodiments, but embraces all aspects and embodiments as covered by the appended claims and equivalents thereof.

According to an illustrative and exemplary aspect of the present invention, the hot plug solution of the present invention can have two major sub-assemblies, a frame member, e.g., mounted to chassis structure of the system, and a bracket (e.g., retention bracket) for holding the PCI compliant card. The frame member has a rail that guides the bracket holding the PCI compliant card (and hence guides the PCI compliant card), so that the PCI compliant card is guided into its inserted position engaging a slot therefor. The slot contains electrical contacts which are electrically connected to busses of, e.g., the computer, and electrical connectors of the PCI compliant card respectively electrically contact the electrical contacts of the slot when the PCI compliant card is guided into its inserted position engaging the slot. Illustratively, and as an example of the present invention, the bracket can have a series of pins that allow the bracket to move along the rail in the frame member. The rear end or back of the bracket (the first end of the bracket entering the guide member) will bottom out at the end of the rail and locate the PCI compliant card in position to engage the slot. The bracket can then be further moved to engage the card in the slot, using, for example, in this illustrative embodiment, a handle and lever on the bracket to provide mechanical leverage to engage the PCI compliant card in place engaging the slot. The use of the rail in the frame member, together with the bracket guided by the rail and the handle and lever on the bracket, in this one illustrative embodiment of the present invention, enables the insertion process to be accomplished in one fluid movement. Thus, the hot plug solution has simplified structure, with a simplicity of execution for hot plug engagement and disengagement of the PCI compliant card and the slot.

According to another example and illustrative embodiment of the present invention, an adjustable retention bracket is provided which will allow a system designer to design around a fixed volume for the bracket without the need of being concerned with the size of the PCI compliant card to be mounted to the system. The adjustable retention bracket can retain the two present-day standard PCI compliant card sizes, and will also accommodate non-standard PCI compliant sizes. According to a further example and illustrative embodiment of the present invention, the adjustable retention bracket can be used as the retention bracket which is one of the two major sub-assemblies of the hot plug solution according to the aforementioned illustrative and exemplary aspect of the present invention. However, the adjustable retention bracket need not be used as part of this hot plug solution, and, rather, can be used in other systems having PCI compliant cards.

This adjustable retention bracket includes a first portion extending along a first edge of the PCI compliant card, in a length direction of the PCI compliant card; and a second portion extending along a second edge of the PCI compliant card, the second edge extending from the first edge, in a height direction of the PCI compliant card. At least one of an effective length of the first portion and an effective length of the second portion, the effective lengths being lengths for holding the PCI compliant card, is adjustable, to accommodate PCI compliant cards with different sizes in the length direction, and to accommodate PCI compliant cards with different sizes in the height direction, respectively.

As an additional example and illustrative embodiment of the present invention, the guiding structure in the frame member can be a channel or a rail in the frame member.

Moreover, to facilitate guiding of the PCI compliant card by the guiding structure, the second section extends continuously from the first section and is arc-shaped, with the third section extending discontinuously from the first section, in the first direction.

The present invention contemplates, as a further example and illustrative embodiment thereof, chassis structure of a computer, including the frame member having guiding structure as discussed previously and a base board. The base board includes the slot for the PCI compliant card. Moreover, the first section of the guiding structure extends in a direction along the slot, parallel to the base board.

According to further examples and illustrative embodiments of the present invention, the second section of the guiding structure includes a first guide slot and the third section of the guiding structure includes a second guide slot. The guiding structure is positioned relative to the slot of the base board such that when the PCI compliant card is positioned by the first and second guide slots of the guiding structure the PCI compliant card is engaged in the slot of the base board.

According to a still further example and illustrative embodiment of the present invention, a retention bracket for use with the aforementioned guiding structure includes a first portion for extending along a first edge of the PCI compliant card, in a length direction thereof, and guided structure on this first portion. This guided structure is to be guided by the guiding structure of the frame member, this guided structure being positioned so as to be able to be located in the second and third sections of the guiding structure to engage the PCI compliant card with the slot therefor, of the baseboard.

According to a still further example and illustrative embodiment of the present invention, the retention bracket which can be used with the aforementioned guiding structure includes a lever at a front location of the first portion, which lever co-acts with the frame member to force the PCI compliant card to enter the slot therefor, of the baseboard. This lever provides a mechanical advantage in providing engagement (and also, disengagement) of the PCI compliant card and the slot therefor.

According to this still further example and illustrative embodiment of the present invention, the lever has a handle at an end thereof, extending away from the first portion of the retention bracket. The lever is slidable along the first portion of the retention bracket, so that only the handle need be exposed when the PCI compliant card is engaged in the slot therefor.

According to this still further example and illustrative embodiment of the present invention, of a retention bracket which can be utilized with the frame member having guiding structure as discussed previously, the retention bracket includes a second portion to extend along a second edge of the PCI compliant card, this second edge extending in a height direction of the PCI compliant card. Moreover, this retention bracket can utilize pins or rollers, as the guided structure, which move along the guiding structure of the aforementioned frame member.

As a still further example and illustrative embodiment of the present invention, there is a hot plug solution. This hot plug solution includes a hot plug structure, and a retention bracket for holding the PCI compliant card. The hot plug structure includes a frame member as discussed previously, having the aforementioned guiding structure to guide a PCI compliant card to enter a slot therefor, of a system. The retention bracket includes a first portion to extend along a first edge of the PCI compliant card, in a length direction of the PCI compliant card, and guided structure on the first portion, to be guided by the guiding structure of the frame member, the guided structure being positioned on the first portion of the retention bracket so as to be able to be located in sections of the guiding structure of the frame member to engage the PCI compliant card with the slot therefor.

According to a still further illustrative aspect of the present invention, there is a frame structure of a computer.

This frame structure includes the retention bracket, and hot plug structure (including the frame member having the guiding structure), as discussed previously. This frame structure also includes a computer frame, having an opening through which the PCI compliant card and the retention bracket can be passed for engaging and disengaging the PCI compliant card with/from a slot therefor. The guiding structure of the frame member is accessible to the guided structure of the retention bracket, through the opening.

According to a still further exemplary aspect of the present invention, the present invention contemplates a computer system including the frame structure of a computer as referred to in the immediately previous paragraph, together with a computer base board within the computer frame. The computer base board has a slot, accessible to a PCI compliant card by way of the guiding structure through the opening. This computer system also includes the PCI compliant card, held by the retention bracket and engaging the slot therefor.

As discussed previously, the present invention also contemplates an adjustable retention bracket for a PCI compliant card. According to one example and illustrative embodiment of this adjustable retention bracket, the effective length of the first portion of the bracket (which extends in a length direction of the PCI compliant card) is adjustable to accommodate PCI compliant cards with different lengths. This first portion can include first and second members, the first member telescoping with the second member so as to adjust the length of the first portion.

According to an alternative example and illustrative embodiment, the first portion has a plurality of positions along the length thereof for positioning the second portion. At each of these plurality of positions, a different effective length of the first portion of the adjustable retention bracket is achieved.

According to another example and illustrative embodiment of the adjustable retention bracket of the present invention, the effective length of the second portion of the adjustable retention bracket (which extends in a height direction of the PCI compliant card) is adjustable to accommodate PCI compliant cards with different heights.

According to still another example and illustrative embodiment of the adjustable retention bracket according to the present invention, the effective length of the first portion and the effective length of the second portion are each adjustable, to accommodate PCI compliant cards respectively with different lengths and with different heights.

According to this example and illustrative embodiment of the adjustable retention bracket of the present invention, the first portion can include first and second members, the first member telescoping with the second member so as to adjust the length of the first portion, and the second portion can include third and fourth members, the third member telescoping with the fourth member so as to adjust the length of the second portion. As a further example and illustrative embodiment, the second and fourth members can be integral with each other.

Additional examples and illustrative embodiments of the present invention include methods for engaging/disengaging PCI cards with/from slots therefor. In one example and illustrative method, the back of the PCI compliant card is introduced to guide structure associated with the slot for this card. This guide structure includes a first guide slot and a second guide slot respectively furthest from and closest to the introduction location of the PCI compliant card to the guide structure. The first and second guide slots each extend to a position closer to the slot for the PCI compliant card, in a first direction, than a remaining part of the guide structure. The PCI compliant card is moved along the guide structure, until the card is guided by the first guide slot, and the PCI compliant card is further moved, guided by the second guide slot, to engage the PCI card with the slot therefor.

Examples and illustrative methods according to the present invention also include disengagement of the PCI compliant card from the slot therefor. In an example and illustrative embodiment thereof, the PCI compliant card is moved along the second guide slot, in a direction away from the slot therefor, to disengage the PCI compliant card from the slot therefor. Then the PCI compliant card is moved along the guide structure (described in the immediately preceding paragraph) to remove the PCI compliant card from the slot therefor.

As a further example and illustrative embodiment of methods of the present invention, the PCI compliant card is held by a bracket. This bracket has structure which is introduced into the aforementioned guide structure and moves in this guide structure, guided thereby. This bracket, desirably, can include a handle extending beyond a front end of the PCI compliant card which is opposite the back thereof, and the further moving of the PCI compliant card guided by the second guide slot includes moving the handle to force the PCI compliant card to engage the slot therefor.

As a still further example and illustrative embodiment of the present invention, the above-mentioned handle includes a lever moving along the guide structure. In moving the handle, the lever is moved against the guide structure to force the PCI compliant card to engage the slot therefor.

Accordingly, by the present invention, structure and methods are provided whereby a PCI compliant card can be engaged with and disengaged from a slot on a base board of a system (e.g., computer), without having to power down the system or remove any chassis components, or even expose any internal components. According to the present invention, the PCI compliant card can be inserted and removed from the rear of the system, and the mechanism does not require much space above the PCI compliant card. A very simple structure, which achieves engagement/disengagement of the PCI compliant card and slot in a fluid movement, is achieved.

In addition, by the present invention, an adjustable retention bracket, providing stability and rigidity for a PCI compliant card, is achieved by a single bracket which can be used for different sizes of PCI cards (the two current standard PCI compliant card sizes, as well as non-standard PCI compliant card sizes).

As a final note, it should be apparent that the structure and methods of the present invention may also have uses in other technical fields besides computers, and with bus structures other than PCI busses, e.g., uses in the telephone switching field to hot swap printed circuit boards with respect to a bus system.

While there have been shown and described several examples and illustrative embodiments in accordance with the present invention, it is understood that the same is not limited thereto, but is susceptible of numerous changes and modifications as known to those skilled in the art. Therefore, the invention is not limited to the details shown and described herein, but is intended to cover all such changes and modifications as are encompassed by the scope of the appended claims, including equivalents thereof.

We claim:

1. Hot plug structure, comprising:

a frame member, having guiding structure adapted to guide a peripheral component interconnect compliant card to enter a slot, of a system, for the peripheral component interconnect compliant card, the guiding structure having a first section spaced in a first direction from the slot; a second section, at a first end portion of the guiding structure, adapted to guide a first end of the peripheral component interconnect compliant card closer to the slot in the first direction; and a third section, at a second end portion of the guiding structure opposite said first end portion, adapted to guide a second end of the peripheral component interconnect compliant card closer to the slot in the first direction, so as to engage the peripheral component interconnect compliant card in the slot, wherein said third section extends discontinuously from the first section, in the first direction.

2. The hot plug structure according to claim 1, wherein said guiding structure is a channel in the frame member.

3. The hot plug structure according to claim 1, wherein said guiding structure is a rail in the frame member.

4. The hot plug structure according to claim 1, wherein said second end portion is an end portion where the peripheral component interconnect compliant card is initially introduced to the guiding structure.

5. The hot plug structure according to claim 4, wherein said second section extends continuously from the first section and is arc-shaped.

6. The hot plug structure to claim 1, wherein the third section extends substantially pependicular to the first section.

7. An adjustable retention bracket for a peripheral component interconnect compliant card having electrical connectors at one edge thereof, comprising:

a first portion to extend along a first edge of the peripheral component interconnect compliant card, in a length direction of the peripheral component interconnect compliant card, said first edge of the peripheral component interconnect compliant card being different than said one edge; and a second portion to extend-along a second edge of the peripheral component interconnect compliant card, the second edge extending from the first edge and extending in a height direction of the peripheral component interconnect compliant card, wherein at least one of an effective length of the first portion and an effective length of the second portion, for holding the peripheral component interconnect compliant card, is adjustable, respectively to accommodate peripheral component interconnect compliant cards with different lengths in the length direction and different heights in the height direction, and wherein the adjustable retention bracket substantially does not extend along said one edge of the peripheral component interconnect compliant card.

8. The adjustable retention bracket according to claim 7, wherein the effective length of the first portion is adjustable to accommodate peripheral component interconnect compliant cards with different lengths.

9. The adjustable retention bracket according to claim 7, consisting essentially of the first and second portion.

10. The adjustable retention bracket according to claim 7, consisting of the first and second portions.

11. Chassis structure of a computer, comprising:

(1) a hot plug structure including a frame member, having guiding structure adapted to guide a peripheral component interconnect compliant card to enter a slot, of a system, for the peripheral component interconnect compliant card, the guiding structure having a first section spaced in a first direction from the slot; a second section, at a first end portion of the guiding structure, adapted to guide a first end of the peripheral component interconnect compliant card closer to the slot in the first direction; and a third section, at a second end portion of the guiding structure opposite said first end portion, adapted to guide a second end of the peripheral component interconnect compliant card closer to the slot in the first direction, so as to engage the peripheral component interconnect compliant card in the slot, wherein said third section extends discontinuously from the first section, in the first direction, and (2) a base board, the base board including the slot, and wherein the first section of the guiding structure extends in a direction along the slot, parallel to the base board.

12. The chassis structure according to claim 11, wherein said second section of the guiding structure includes a first guide slot and the third section of the guiding structure includes a second guide slot, and wherein the guiding structure is positioned relative to the slot of the base board such that when the peripheral component interconnect compliant card is positioned by the first and second guide slots the peripheral component interconnect compliant card is engaged in the slot of the base board.

13. A retention bracket for use with a hot plug structure which includes a frame member, the frame member having guiding structure adapted to guide a peripheral component interconnect compliant card to enter a slot, of a system, for the peripheral component-interconnect compliant card, the guiding structure having a first section spaced in a first direction from the slot; a second section, at a first end portion of the guiding structure, adapted to guide a first end of the peripheral component interconnect compliant card closer to the slot in the first direction; and a third section, at a second end portion of the guiding structure opposite said first end portion, adapted to guide a second end of the peripheral component interconnect compliant card closer to the slot in the first direction, so as to engage the peripheral component interconnect compliant card in the slot, the retention bracket comprising a first portion to extend along a first edge of the peripheral component interconnect compliant card, in a length direction of the peripheral component interconnect compliant card, and guided structure on the first portion, adapted to be guided by said guiding structure of said frame member, said guided structure being positioned on the first portion so as to be able to be located in the second and third sections of the guiding structure to engage the peripheral component interconnect compliant card with the slot, wherein said peripheral component interconnect compliant card has electrical connectors along one edge, said one edge being different than said first edge, and the retention bracket substantially does not extend along said one edge of the peripheral component interconnect compliant card.

14. The retention bracket according to claim 13, further comprising a lever at a front location of the first portion, which co-acts with the frame member to force the peripheral component interconnect compliant card to enter the slot.

15. The retention bracket according to claim 14, further comprising a handle at an end of the lever extending away from the first portion of the retention bracket, and wherein the lever is slidable along the first portion of the retention bracket so that only the handle need be exposed when the peripheral component interconnect compliant card is engaged in the slot.

16. The retention bracket according to claim 13, further comprising a second portion to extend along a second edge of the peripheral component interconnect compliant card, the second edge extending from the first edge in a height direction of the peripheral component interconnect compliant card.

17. The retention bracket according to claim 13, wherein said guided structure includes pins or rollers which move along said guiding structure.

18. A hot plug peripheral component interconnect solution, comprising:
(1) a hot plug structure which includes a frame member, the frame member having guiding structure adapted to guide a peripheral component interconnect compliant card to enter a slot, of a system, for the peripheral component interconnect compliant card, the guiding structure having a first section spaced in a first direction from the slot; a second section, at a first end portion of the guiding structure, adapted to guide a first end of the peripheral component interconnect compliant card closer to the slot in the first direction; and a third section, at a second end portion of the guiding structure opposite said first end portion, adapted to guide a second end of the peripheral component interconnect compliant card closer to the slot in the first direction, so as to engage the peripheral component interconnect compliant card in the slot, wherein said third section extends discontinuously from the first section, in the first direction, and
(2) a retention bracket for holding said peripheral component interconnect compliant card, said retention bracket comprising a first portion to extend along a first edge of the peripheral component interconnect compliant card, in a length direction of the peripheral component interconnect compliant card, and guided structure on the first portion, to be guided by said guiding structure of said frame member, said guided structure being positioned on the first portion so as to be able to be located in the second and third sections of the guiding structure to engage the peripheral component interconnect compliant card with the slot.

19. A frame structure of a computer, comprising:
(1) a hot plug peripheral component interconnect solution including (a) a hot plug structure which includes a frame member, the frame member having guiding structure adapted to guide a peripheral component interconnect compliant card to enter a slot, of a system, for the peripheral component interconnect compliant card, the guiding structure having a first section spaced in a first direction from the slot; a second section, at a first end portion of the guiding structure, adapted to guide a first end of the peripheral component interconnect compliant card closer to the slot in the first direction; and a third section, at a second end portion of the guiding structure opposite said first end portion, adapted to guide a second end of the peripheral component interconnect compliant card closer to the slot in the first direction, so as to engage the peripheral component interconnect compliant card in the slot, wherein said third section extends discontinuously from the first section, in the first direction; and (b) a retention bracket for holding said peripheral component interconnect compliant card, said retention bracket comprising a first portion to extend along a first edge of the peripheral component interconnect compliant card, in a length direction of the peripheral component interconnect compliant card, and guided structure on the first portion, to be guided by said guiding structure of said frame member, said guided structure being positioned on the first portion so as to be able to be located in the second and third sections of the guiding structure to engage the peripheral component interconnect compliant card with the slot; and
(2) a computer frame, having an opening through which the peripheral component interconnect compliant card and the retention bracket can be passed for engaging the peripheral component interconnect compliant card with, and disengaging the peripheral component interconnect compliant card from, the slot, the guiding structure of the frame member being accessible to the guided structure of the retention bracket through the opening.

20. A computer system, comprising:
(I) a frame structure of a computer which includes a hot plug peripheral component interconnect solution including (a) a hot plug structure which includes a frame member, the frame member having guiding structure adapted to guide a peripheral component interconnect compliant card to enter a slot, of a system, for the peripheral component interconnect compliant card, the guiding structure having a first section spaced in a first direction from the slot; a second section, at a first end portion of the guiding structure, adapted to guide a first end of the peripheral component interconnect compliant card closer to the slot in the first direction; and a third section, at a second end portion of the guiding structure opposite said first end portion, adapted to guide a second end of the peripheral component interconnect compliant card closer to the slot in the first direction, so as to engage the peripheral component interconnect compliant card in the slot, wherein said third section extends discontinuously from the first section, in the first direction; and (b) a retention bracket for holding said peripheral component interconnect compliant card, said retention bracket comprising a first portion to extend along a first edge of the peripheral component interconnect compliant card, in a length direction of the peripheral component interconnect compliant card, and guided structure on the first portion, to be guided by said guiding structure of said frame member, said guided structure being positioned on the first portion so as to be able to be located in the second and third sections of the guiding structure to engage the peripheral component interconnect compliant card with the slot;

(II) a computer frame, having an opening through which the peripheral component interconnect compliant card and the retention bracket can be passed for engaging the peripheral component interconnect compliant card with, and disengaging the peripheral component interconnect compliant card from, the slot, the guiding structure of the frame member being accessible to the guided structure of the retention bracket through the opening;

(III) a computer base board within the computer frame, the computer base board having said slot, accessible to the peripheral component interconnect compliant card by way of the guiding structure through the opening; and (IV) the peripheral component interconnect compliant card, held by the retention bracket and engaging the slot.

21. A method of hot plug engagement of a peripheral component interconnect compliant card and a slot therefor, comprising the steps of:

introducing the back of the peripheral component interconnect compliant card to guide structure of a frame member associated with the slot, the guide structure of the frame member including a first guide slot and a second guide slot respectively furthest from and closest to the introduction location of the peripheral component interconnect compliant card to the guide structure, the first and second guide slots each extending to a position closer to the slot, in a first direction, than a remaining part of the guide structure, the second guide slot extending discontinuously from the remaining part of the guide structure;

moving the peripheral component interconnect compliant card along the guide structure, until said card is guided by said first guide slot; and further moving the peripheral component interconnect compliant card guided by said second guide slot discontinuously from the remaining part of the guide structure, to engage said card in said slot for the peripheral component interconnect compliant card.

22. The method according to claim 21, further comprising the steps of moving the peripheral component interconnect compliant card along the second guide slot, in a direction away from the slot for the peripheral component interconnect compliant card, to disengage the peripheral component interconnect compliant card therefrom, and then moving the peripheral component interconnect compliant card along the guide structure to remove the peripheral component interconnect compliant card from the slot therefor.

23. The method according to claim 21, wherein the peripheral component interconnect compliant card is held by a retention bracket, and wherein the retention bracket has structure introduced into the guide structure and moving in the guide structure, guided thereby.

24. The method according to claim 23, wherein the retention bracket further includes a handle extending beyond a front end of the peripheral component interconnect compliant card which is opposite the back thereof, and wherein said further moving includes moving said handle to force the peripheral component interconnect compliant card to engage the slot theref or.

25. The method according to claim 24, wherein said handle includes a lever moving along the guide structure, and said moving said handle moves said lever against the guide structure to force the peripheral component interconnect compliant card to engage the slot.

26. The method according to claim 21, wherein the second guide slot extends substantially perpendicular to the remaining part of the guide structure.

27. A method of hot plug disengagement of a peripheral component interconnect compliant card from a slot therefor, comprising the steps of:

moving the peripheral component interconnect compliant card along a first guide slot of a guide structure associated with the slot for the card, to disengage the peripheral component interconnect compliant card from the slot for the card, the first guide slot extending discontinuously from a remaining part of the guide structure; and thereafter, moving the peripheral component interconnect compliant card along the remaining part of the guide structure to remove the peripheral component interconnect compliant card from the slot for the card.

28. The method according to claim 27, wherein the first guide slot extends substantially perpendicular to the remaining part of the guide structure.

29. An adjustable retention bracket for a peripheral component interconnect compliant card, comprising:

a first portion to extend along a first edge of the peripheral component interconnect compliant card, in a length direction of the peripheral component interconnect compliant card; and a second portion to extend along a second edge of the peripheral component interconnect compliant card, the second edge extending from the first edge and extending in a height direction of the peripheral component interconnect compliant card, wherein an effective length of the first portion, for holding the peripheral component interconnect compliant card, is adjustable, to accommodate peripheral component interconnect compliant cards with different lengths in the length direction, and wherein the first portion includes a first member and a second member, the first member telescoping with the second member so as to adjust the effective length of the first portion.

30. An adjustable retention bracket for a peripheral component interconnect compliant card, comprising:

a first portion to extend along a first edge of the peripheral component interconnect compliant card, in a length direction of the peripheral component interconnect compliant card; and a second portion to extend along a second edge of the peripheral component interconnect compliant card, the second edge extending from the first edge and extending in a height direction of the peripheral component interconnect compliant card, wherein an effective length of the first portion, for holding the peripheral component interconnect compliant card, is adjustable, to accommodate peripheral component interconnect compliant cards with different lengths in the length direction, and wherein the first portion has a plurality of positions along the length thereof for positioning the second portion, providing different effective lengths of the first portion respectively at the plurality of positions.

31. An adjustable retention bracket for a peripheral component interconnect compliant card, comprising:

a first portion to extend along a first edge of the peripheral component interconnect compliant card, in a length direction of the peripheral component interconnect compliant card; and a second portion to extend along a second edge of the peripheral component interconnect compliant card, the second edge extending from the first edge and extending in a height direction of the peripheral component interconnect compliant card, wherein an effective length of the second portion, for holding the peripheral component interconnect compliant card, is adjustable, to accommodate peripheral component interconnect compliant cards with different heights.

32. An adjustable retention bracket for a peripheral component interconnect compliant card, comprising:

a first portion to extend along a first edge of the peripheral component interconnect compliant card, in a length direction of the peripheral component interconnect compliant card; and a second portion to extend along a second edge of the peripheral component interconnect compliant card, the second edge extending from the first edge and extending in a height direction of the peripheral component interconnect compliant card, wherein an effective length of the first portion and an effective length of the second portion, for holding the peripheral component interconnect compliant card, are adjustable, to accommodate peripheral component interconnect compliant cards with different lengths in the length direction and different heights in the height direction.

33. The adjustable retention bracket according to claim 32, wherein the first portion includes first and second members, the first member telescoping with the second member so as to adjust the length of the first portion, wherein the second portion includes third and fourth members, the third member telescoping with the fourth member so as to adjust the length of the second portion, and wherein the second and fourth members are integral with each other.

34. An adjustable retention bracket for a peripheral component interconnect compliant card, comprising:

a first portion to extend along a first edge of the peripheral component interconnect compliant card, in a length direction of the peripheral component interconnect compliant card; and a second portion to extend along a second edge of the peripheral component interconnect compliant card, the second edge extending from the first edge and extending in a height direction of the peripheral component interconnect compliant card, wherein at least one of an effective length of the first portion and an effective length of the second portion, for holding the peripheral component interconnect compliant card, is adjustable, respectively to accommodate peripheral component interconnect compliant cards with different lengths in the length direction and in the height direction, and wherein each of the first and second portions includes fastening structure to fasten the first and second portions to the peripheral component interconnect compliant card.

35. An adjustable retention bracket for a peripheral component interconnect compliant card, comprising:

a first portion to extend along a first edge of the peripheral component interconnect compliant card, in a length direction of the peripheral component interconnect compliant card; and a second portion to extend along a second edge of the peripheral component interconnect compliant card, the second edge extending from the first edge and extending in a height direction of the peripheral component interconnect compliant card, wherein at least one of an effective length of the first portion and an effective length of the second portion, for holding the peripheral component interconnect compliant card, is adjustable, respectively to accommodate peripheral component interconnect compliant cards with different lengths in the length direction and in the height direction, and wherein the first portion includes guided structure at front and rear locations thereof, to be guided in guiding structure of a frame member in engaging the peripheral component interconnect compliant card with a slot for the peripheral component interconnect compliant card.

* * * * *